US009460925B2

(12) United States Patent
Wang et al.

(10) Patent No.: US 9,460,925 B2
(45) Date of Patent: Oct. 4, 2016

(54) SYSTEM AND APPARATUS FOR EFFICIENT DEPOSITION OF TRANSPARENT CONDUCTIVE OXIDE

(71) Applicant: SolarCity Corporation, San Mateo, CA (US)

(72) Inventors: Wei Wang, San Jose, CA (US); Jianming Fu, Palo Alto, CA (US); Zheng Xu, Pleasanton, CA (US); Kenneth Reese Reynolds, San Jose, CA (US); Ollivier Jacky Lefevre, Pleasanton, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days.

(21) Appl. No.: 14/933,957

(22) Filed: Nov. 5, 2015

(65) Prior Publication Data
US 2016/0126098 A1     May 5, 2016

Related U.S. Application Data

(60) Provisional application No. 62/075,824, filed on Nov. 5, 2014.

(51) Int. Cl.
*H01L 27/01* (2006.01)
*H01L 27/12* (2006.01)
(Continued)

(52) U.S. Cl.
CPC ......... *H01L 21/2253* (2013.01); *C23C 14/086* (2013.01); *C23C 14/28* (2013.01);
(Continued)

(58) Field of Classification Search
CPC .................. H01L 21/02675; H01L 21/02252; H01L 21/1203; H01L 21/2253; H01L 21/28211; H01L 21/76825; H01L 21/76826; H01L 23/022466; H01L 51/442; C23C 16/458; C23C 16/513

USPC ........ 438/729, 513, 514; 257/347, 427, 359, 257/428, 659, 660, 678, E21.006, E21.134, 257/E21.135, E21.143, E21.147, E21.218, 257/E21.311, E21.32, E21.347, E21.498
See application file for complete search history.

(56) References Cited

U.S. PATENT DOCUMENTS

| 5,009,922 A | 4/1991 | Harano et al. |
| 5,308,461 A | 5/1994 | Ahonen et al. |

(Continued)

FOREIGN PATENT DOCUMENTS

| EP | 0720206 A1 | 7/1996 |
| EP | 2045838 A1 | 4/2009 |

(Continued)

OTHER PUBLICATIONS

Iwata, K. et al.; "Improvement of ZnO TCO film growth for photovoltaic devices by reactive plama deposition (RPD)"; Elsevier—Thin Solid Films; 480-481 (2005); pp. 199-203.

(Continued)

*Primary Examiner* — David Nhu
(74) *Attorney, Agent, or Firm* — Kilpatrick Townsend & Stockton LLP

(57) ABSTRACT

A substrate processing system that includes a substrate processing chamber having one or more sidewalls that at least partially define a substrate processing region and extend away from a bottom wall of the substrate processing chamber at an obtuse angle; a source material holder configured to hold a source material within the substrate processing region; a plasma gun operatively coupled to introduce a plasma beam into the substrate processing region; one or more magnets operatively arranged to generate a magnetic field that guides the plasma beam to the source material holder; and a substrate carrier configured to hold one or more substrates within the substrate processing region.

25 Claims, 11 Drawing Sheets

(51) Int. Cl.
   *H01L 31/0392*   (2006.01)
   *H01L 21/225*   (2006.01)
   *C23C 16/513*   (2006.01)
   *C23C 16/458*   (2006.01)
   *C23C 14/08*   (2006.01)
   *C23C 14/28*   (2006.01)
   *C23C 14/56*   (2006.01)
   *H01L 31/18*   (2006.01)
   *H01J 37/32*   (2006.01)

(52) U.S. Cl.
   CPC .......... *C23C 14/562* (2013.01); *C23C 16/458* (2013.01); *C23C 16/513* (2013.01); *H01J 37/32009* (2013.01); *H01L 31/1884* (2013.01)

(56) References Cited

U.S. PATENT DOCUMENTS

| | | |
|---|---|---|
| 5,557,172 A | 9/1996 | Tanaka |
| 5,635,087 A | 6/1997 | Schiller et al. |
| 6,160,350 A * | 12/2000 | Sakemi .................. C23C 14/32 315/111.41 |
| 6,220,204 B1 | 4/2001 | Makino et al. |
| 6,245,394 B1 | 6/2001 | Sakemi et al. |
| 6,261,694 B1 | 7/2001 | Iacovangelo |
| 6,394,025 B1 | 5/2002 | Sakemi et al. |
| 6,737,121 B2 | 5/2004 | Iacovangelo et al. |
| 8,226,795 B2 * | 7/2012 | Brass .................... H01F 7/0252 156/345.51 |
| 8,343,387 B2 | 1/2013 | Abe et al. |
| 2006/0225998 A1 * | 10/2006 | Song ..................... C23C 14/355 204/192.11 |
| 2012/0315439 A1 | 12/2012 | Nakayama et al. |
| 2014/0061041 A1 * | 3/2014 | Riker et al. ......... C23C 14/3407 204/298.12 |

FOREIGN PATENT DOCUMENTS

| | | |
|---|---|---|
| EP | 2463255 A1 | 6/2012 |
| JP | H07138743 A | 5/1995 |
| JP | H07258833 A | 10/1995 |
| JP | 2010013672 A | 1/2010 |

OTHER PUBLICATIONS

Partial Search Report mailed Feb. 5, 2016 in PCT Application No. PCT/US2015/059346; 7 pages.

International Search Report and Written Opinion mailed Apr. 13, 2016 in PCT Application No. PCT/US2015/059346; 18 pages.

* cited by examiner

SYSTEM AND APPARATUS FOR EFFICIENT DEPOSITION OF TRANSPARENT CONDUCTIVE OXIDE

CROSS REFERENCE TO RELATED APPLICATIONS

This application claims the benefit of U.S. Provisional Application No. 62/075,824, filed Nov. 5, 2014, entitled "System and Apparatus For Efficient Deposition of Transparent Conductive Oxide," the disclosure of which is incorporated by reference herein in its entirety.

BACKGROUND OF THE INVENTION

Embodiments of the disclosure pertain to methods, systems and apparatus for depositing transparent conductive oxide material on a substrate, such as a silicon wafer.

Transparent conductive oxides (TCO) are doped metal oxides used as transparent conducting layers in photovoltaic devices, such as solar cells. One method of depositing TCO material is referred to as reactive plasma deposition (RPD) in which a plasma gun generates a plasma beam that is guided toward a source via an electric magnetic field. The bombardment of the source with the plasma beam results in the source reaching its sublimation temperature. As a result the source material becomes vaporized and ionized before being deposited on the surface of a substrate within the chamber.

During the deposition process the ions and neutrals travel at various different angles (following a cosine distribution function) and may encounter and be deposited upon the sidewalls of the process chamber instead of the substrate. Any TCO material that is deposited on the sidewalls of the chamber results a loss of some ions and neutrals, which in turn represents a less than optimal use of the source (raw) material of the process.

The cost of producing products that include one or more thin film TCO layers deposited over a substrate, such as solar panels, in a commercial setting can be reduced by obtaining a high yield of the source material (i.e., the percentage of source material consumed is deposited on the substrate) as well as by depositing the source material on the substrate at a high deposition rate while ensuring relatively uniform deposition thickness across the substrate. Cost can also be reduced by reducing the overall footprint that deposition tools require within a fabrication facility so that more tools can fit within the facility in a given square foot area.

BRIEF SUMMARY

Embodiments of the disclosure pertain to methods, systems and apparatus for depositing transparent conductive oxide (TCO) and other types of material on a substrate. TCO and other types of materials deposited according to the techniques described herein can be deposited over a substrate with one or more of an improved yield rate, improved deposition rate and improved deposition uniformity. Embodiments of the disclosure can be used to deposit TCO and other materials for many different applications and are particularly well suited for depositing TCO layers over substrates used in the manufacture of solar cells. Some embodiments of the disclosure also provide systems and tools that allow deposition of thin film TCO and other thin film materials over a given sized substrate that have a reduced footprint as compared to other commonly used deposition systems and tools designed to deposit material over the same sized substrate.

According to some embodiments of the disclosure, at least two of the sidewalls of a substrate processing chamber extend away from a center of the substrate processing chamber at an obtuse angle so that the when the source material ions scatter at an angle away from a source material holder after being ionized by a plasma beam, the angled sidewall reduces the possibility of collision with the sidewall which, in turn increases the probability of the ionized source material colliding with the substrate instead.

Some embodiments of the disclosure pertain to a substrate processing system that includes: a substrate processing chamber having one or more sidewalls that at least partially define a substrate processing region and extend away from a bottom wall of the substrate processing chamber at an obtuse angle; a source material holder configured to hold a source material within the substrate processing region; a plasma gun operatively coupled to introduce a plasma beam into the substrate processing region; one or more magnets operatively arranged to generate a magnetic field that guides the plasma beam to the source material holder; and a substrate carrier configured to hold one or more substrates within the substrate processing region.

The one or more angled sidewalls can include first and second opposing sidewalls spaced apart on opposite sides of the source material holder and the plasma gun can be positioned adjacent to the first opposing sidewall with the gun pointing in a direction perpendicular to the first opposing sidewall. In some embodiments at least one of the one or more chamber sidewalls includes a first section that extends substantially vertically from a bottom of the chamber and a second section that extends from the first section towards a top of the chamber at the obtuse angle. In some other embodiments, the one or more angled sidewalls include first and second opposing sidewalls spaced apart on opposite sides of the source material holder with each of the first and second opposing sidewalls including a first section that extends substantially vertically from a bottom of the chamber and a second section that extends from the first section towards a top of the chamber at the obtuse angle.

In some examples the substrate processing system can further include a substrate transport mechanism that is configured to move the substrate carrier through the substrate processing region during a substrate deposition process. The substrate carrier can hold a plurality of substrates and can have first and second opposing ends that define a length of the substrate carrier and a width that is greater than the length. In some instances the substrate transport mechanism is configured to move the substrate carrier through the substrate processing region during a substrate deposition process along a linear path at a constant speed such that the substrate carrier enters the substrate processing region with its first end and exits the substrate processing region with its second end.

In some embodiments the substrate carrier can include a plurality of interconnected panels connected to each other by hinges with each panel extending along a length of the substrate carrier and configured to hold a plurality of substrates. The substrate transport mechanism can be configured to move the substrate carrier through the substrate processing region during a substrate deposition process such that the panels of the substrate carrier are in a domed-shape as the substrate carrier passes through the substrate processing region. The substrate transport mechanism can be further configured to move the substrate carrier into and out of the substrate processing chamber in a substantially flat shape, and in some instance the substrate transport system can include a plurality of rails that align with the hinges between interconnected panels.

In various embodiments the substrate carrier can include a plurality of interconnected panels that extend along a length of the substrate carrier including first and second opposing inner panels spaced apart from each other in a mirrored relationship and third and fourth opposing outer panels spaced apart from each other in a mirrored relationship. Each of the plurality of panels can be a substantially flat rectangular panel configured to hold a plurality of substrates and the plurality of panels can be connected together by hinges that enable a cross-sectional shape of the substrate carrier (along a width of the carrier) to be transformed from a substantially flat, pancake shape to a dome-shaped carrier. In some instances the substrate carrier can further include a central panel positioned between the first and second inner panels.

In some embodiments a substrate processing system is provided that include: a substrate processing chamber having one or more sidewalls that at least partially define a substrate processing region; a plurality of source material holders positioned within the substrate processing region, each configured to hold source material; a plurality of plasma guns corresponding to the plurality of source material holders, each plasma gun in the plurality of plasma guns being operatively coupled to introduce a plasma beam into the substrate processing region; a plurality of magnets operatively arranged to generate magnetic fields that, for each plasma beam generated by a plasma gun in the plurality of plasma guns, directs the plasma beam to its corresponding source material holder; a substrate carrier configured to hold a plurality of substrates; and a substrate transport mechanism configured to move the substrate carrier through the substrate processing chamber such that the plurality of substrates are moved through the substrate processing region.

In some instances the one or more angled sidewalls can include first and second opposing sidewalls spaced apart on opposite sides of the plurality of source material holders, each extending away from a bottom wall of the substrate processing chamber at an obtuse angle, and the plurality of plasma guns can include a first set of plasma guns positioned adjacent to the first opposing sidewall with the first set of plasma guns pointing in a direction perpendicular to the first opposing sidewall and a second set of plasma guns positioned adjacent to the second opposing sidewall with the second set of plasma pointing in a direction perpendicular to the second opposing sidewall.

In some instances the plurality of source material holders can be positioned in an evenly-spaced staggered relationship such that a distribution of source material from each adjacent source material holder overlaps.

A method of depositing a TCO layer over a plurality of substrates with a reactive plasma deposition process is provided in some embodiments. The method can include: holding source material for the reactive plasma deposition process in a source material holder positioned within a substrate processing chamber; generating a plasma beam from a plasma gun; ionizing the source material by directing the plasma with a plurality of magnets to bombard the source material and generate ionized source material within a substrate processing region of the substrate processing chamber; transporting the plurality of substrates through the substrate processing region of a substrate processing chamber in a substrate carrier to deposit the source material over the substrates, wherein the substrate carrier comprises a plurality of interconnected panels that enter the substrate processing chamber in a substantially flat arrangement that and the plurality of interconnected panels are formed into a dome-shaped arrangement prior to passing through the substrate processing region.

In some additional embodiments a substrate processing system is provided that includes a substrate processing chamber having one or more sidewalls that at least partially define a substrate processing region; a source material holder configured to hold a source material within the substrate processing region; a plasma gun positioned within the substrate processing chamber and operatively coupled to introduce a plasma beam into the substrate processing region; one or more magnets operatively arranged to generate a magnetic field that guides the plasma beam to the source material holder; and a substrate holder configured to hold a substrate within the substrate processing region.

These and other embodiments are described below in the following detailed description together with the accompanying drawings in which the same reference numerals are sometimes used in multiple figures to designate similar or identical structural elements to provide a better understanding of the nature and advantages of the present disclosure.

Reference will now be made in detail to representative embodiments illustrated in the accompanying drawings. It should be understood that the following descriptions are not intended to limit the embodiments to any particular preferred embodiment. To the contrary, it is intended to cover alternatives, modifications, and equivalents as can be included within the spirit and scope of the described embodiments as defined by the accompanying claims.

DETAILED DESCRIPTION

Embodiments of the disclosure pertain to methods, systems and apparatus for depositing thin film transparent conductive oxide (TCO) and other types of thin film materials on a substrate using reactive plasma deposition (RPD) techniques at improved yield rates, improved deposition rates and/or improved deposition uniformity as compared to some commonly used TCO deposition techniques. Some embodiments of the disclosure also provide systems and tools that allow deposition of thin film TCO and other thin film materials over a given sized substrate that have a reduced footprint as compared to other commonly used deposition systems and tools designed to deposit material over the same sized substrate.

Figure 1:
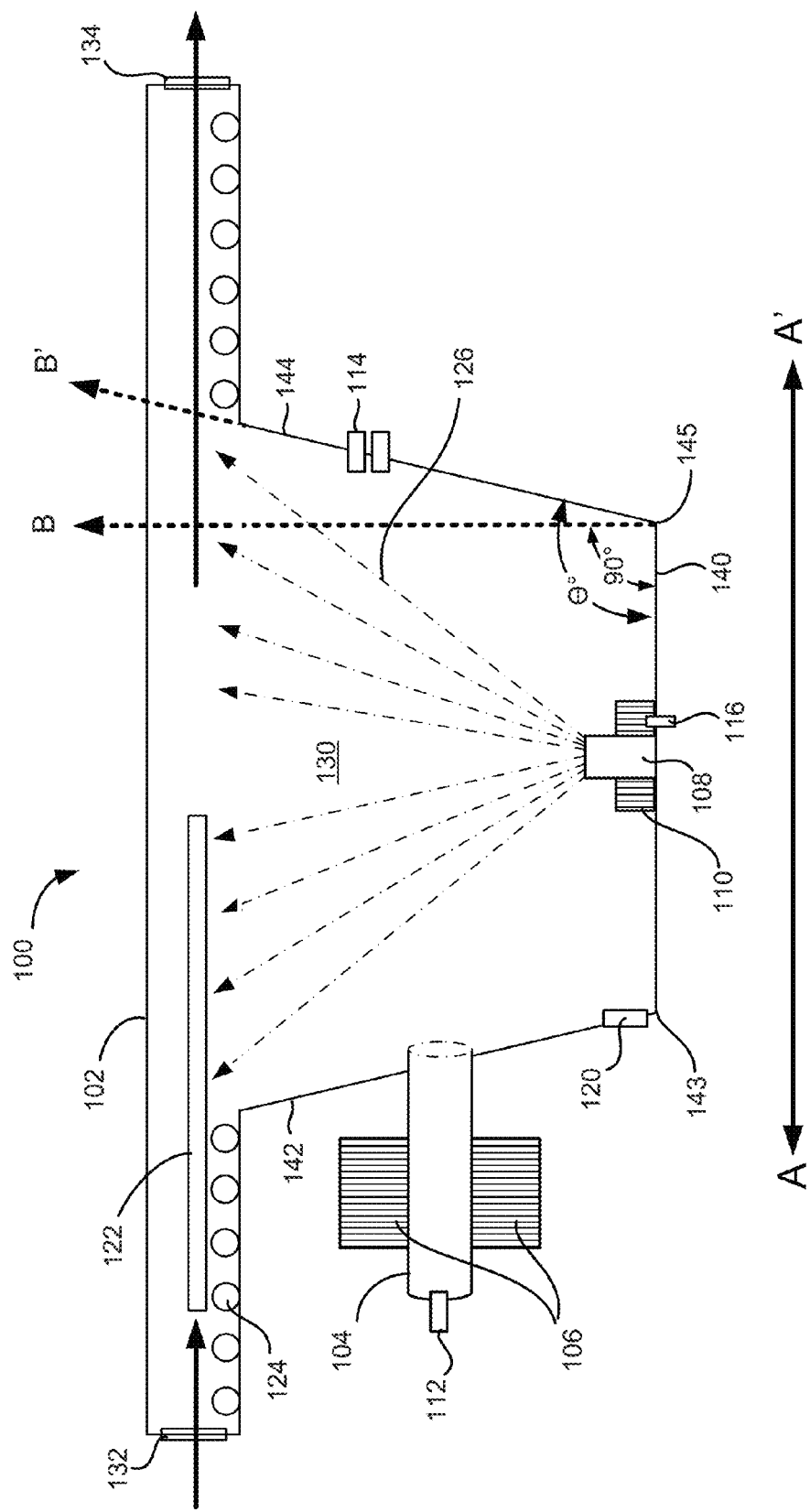
FIG. 1 is a simplified cross-sectional illustration of a substrate processing system according to some embodiments of the disclosure.

FIG. 1 is a simplified cross-sectional illustration of a reactive plasma deposition (RPD) substrate processing system 100 according to some embodiments of the disclosure. Substrate processing system 100 includes a substrate processing chamber 102, a plasma gun 104, a first electromagnet 106, a source material holder 108, a second electromagnet 110 and one or more gas nozzles 112, 114 and 116. System 100 can also include an exhaust valve 120 (e.g., a throttle valve) and vacuum system (not shown) that control the pressure within chamber 102 as well as a temperature control system (also not shown) that can control the temperature of the chamber and substrate.

During a substrate deposition process, a sputtering gas, such as argon (Ar), is introduced into plasma gun 104 from gas nozzle 112. The plasma gun 104 generates a plasma beam of positive ions (e.g., argon ions, Ar+, when argon is used as the sputtering gas) and negative electrons (e−). The plasma beam is then introduced into processing chamber 102 and guided by a magnetic field generated by magnets 106 and 110 towards a source material (not shown) held in a source material holder 108.

As the plasma beam bombards the source material, the surface temperature of the source material reaches a sublimation point and becomes "vaporized" and ionized. System 100 can be a batch reactor in which multiple substrates (not shown) positioned within a substrate carrier 122 are processed simultaneously. The substrate carrier 122 can enter and exit the substrate processing chamber 102 though slit valves 132 and 134, respectively, while the vacuum system maintains vacuum conditions within the substrate processing chamber 102.

While the substrate carrier is within the substrate processing chamber 102, the substrate carrier 122 can be transported by a substrate transport system along a conveyor belt 124 or similar mechanism through a substrate processing region 130 of the chamber 102 at a constant rate of speed along direction A-A'. Ions and neutrals generated by the sublimation process scatter away from the ion source (as shown by arrows 126 resulting in deposition on substrates carried by the substrate carrier 122 in the substrate processing region 130 as well as some deposition on the chamber sidewalls.

As shown in FIG. 1, chamber 102 includes at least two opposing sidewalls 142, 144 that extend away from a bottom wall 140 of the chamber at an obtuse angle so that the when ions and neutrals traveling at various angles away from the source material holder are less likely to collide with one of the angled sidewalls as compared to if the sidewalls extended vertically (i.e., at a 90 degree angle) from chamber bottom 140 at edges 143 and 145, respectively. For example, the angle of the sidewalls with respect to the bottom wall 140 is shown by angle θ, which is greater than the 90 degree angle between the bottom wall 140 and dotted line B that represents an imaginary vertical sidewall according to some previously known substrate processing chambers. Since ions are less likely to collide with the angled sidewalls, chamber 122 has a reduced amount of unwanted sidewall deposition as compared to conventional chambers. The reduction in sidewall deposition, in turn, results in an increased likelihood that ions and neutrals will contact the substrates (e.g., silicon wafers) positioned on a substrate holder during the deposition process and thus results in a higher yield than if the substrate processing chamber had vertical sidewalls.

Figure 2A:
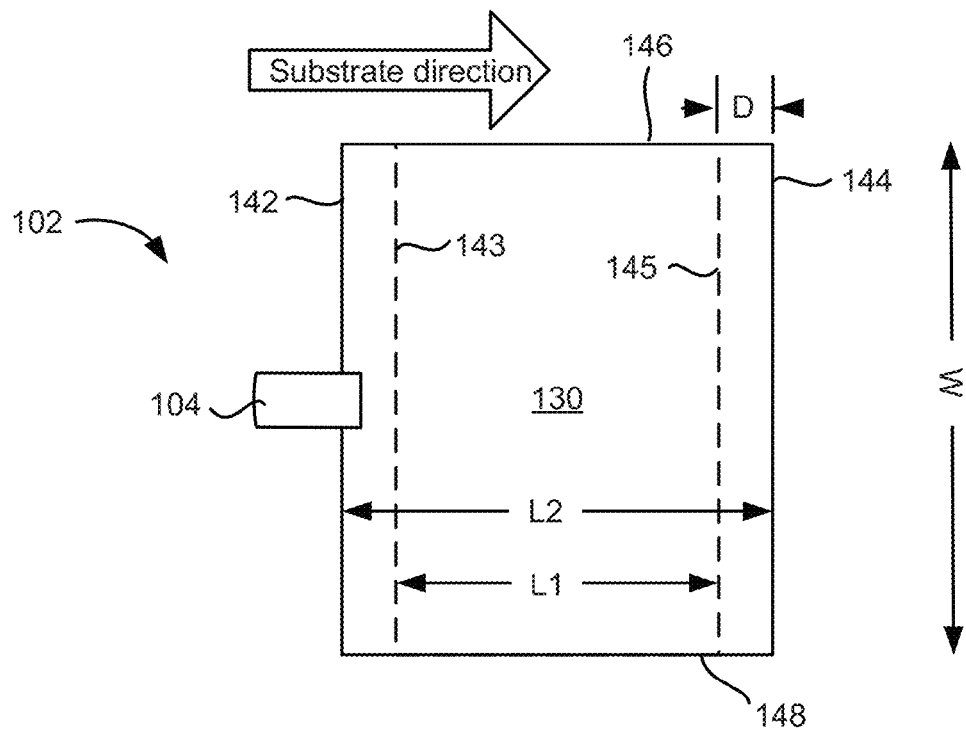
FIG. 2A is a simplified top view schematic diagram of a substrate processing system according to some embodiments of the disclosure.

In some embodiments, substrate carrier 122 is wider than it is long and substrate processing chamber 102 is sized accordingly. For example, as shown in FIG. 2A, which is a simplified top view of a substrate processing chamber 102, substrate processing region 130 within substrate processing chamber 102 can have a generally rectangular-shaped cross-ssection when viewed from the top. In FIG. 2A, sidewalls 142, 144 are shown as extending outward from bottom edges 143, 145 by a distance D which depends on the angle θ (shown in FIG. 1) as well as the height of the sidewalls. Because sidewalls 142, 144 extend across the width of chamber 102, which is larger than the length in the substrate deposition zone 130, sidewalls 142, 144 are longer than sidewalls 146, 148 that extend along a length of the substrate processing chamber 102 in the substrate deposition zone. Thus, sidewalls 142, 144 have more surface area that can be a potential deposition site for to ionized source material than sidewalls 146, 148. In some embodiments, sidewalls 146, 148 are spaced apart by a width, W, that is at least 100% longer than the length, L1, between sidewalls 142, 144 at the bottom of substrate processing chamber 102, and in one particular embodiment, W can be approximately 1.6 meters while L1 can be approximately 0.6 meters.

Figure 2B:
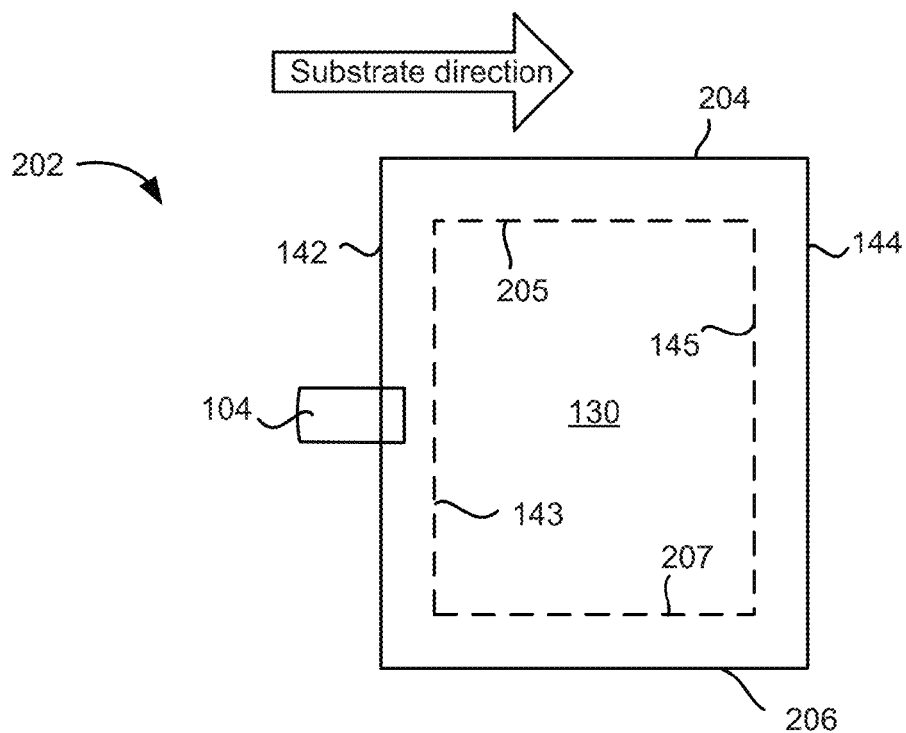
FIG. 2B is a simplified top view schematic diagram of a substrate processing system according to some embodiments of the disclosure.

In the embodiment shown in FIG. 2A, sidewalls 146, 148 (not shown in FIG. 1) can be generally vertical and thus do not extend upwards from an edge of bottom surface 120 at an angle in the same manner as sidewalls 142, 144. Thus, in the embodiment shown in FIG. 2A opposing sidewalls 142, 144 are the only sidewalls extending at an obtuse angle from the chamber bottom. In other embodiments, however, all the sidewalls of the chamber can extend outward at an angle. For example, in FIG. 2B, which is a simplified top view of a substrate processing chamber 202, four sidewalls including opposing sidewalls 142, 144 and opposing sidewalls 204, 206 extend outward from a bottom of the chamber. As shown in FIG. 2B, sidewalls 142, 144 extend outward from bottom edges 143, 145 in the same manner as chamber 102. Chamber 202, however, also has sidewalls 204, 206 extending outward from edges 205, 207, respectively at the bottom of chamber 202. In some embodiments all four sidewalls extend outward at the same angle, but other embodiments of the disclosure may vary the angle at which sidewalls 204, 206 extend outward such that the angle of sidewalls 204, 206 is smaller than or greater than the angle that sidewalls 142, 144 extend out from the bottom of the chamber. Additionally, in some embodiments the angles of each opposing wall (e.g., sidewall 142 and sidewall 144 or sidewall 204 and sidewall 206) extends away from the bottom of the substrate processing chamber can differ.

Referring back to FIG. 1, the plasma gun 106, which is positioned outside of the chamber 102, is shown as pointing essentially at a 90 degree angle to the source material at which the plasma gun is directed. The plasma gun extends into the chamber 102 through an opening in the sidewall 142 and the magnets 108 and 110 direct the stream of ions generated from the plasma gun 106 to the source material held within source material holder 108. While not shown in FIG. 1, in some embodiments where plasma gun 106 is positioned next to and extends through an angled sidewall, such as sidewall 142, the plasma gun can be tilted upwards to accommodate the angled wall (i.e., the plasma gun can extend perpendicularly through the angled wall) while magnets direct the beam from its initial upward angle to the source material.

Chamber 102 can be sized and shaped to process very large substrates, such as trays of silicon wafers. For example, in some embodiments chamber 102 can be about one meter wide, two meters wide or even wider and have a substrate processing region that is about one meter or half a meter long. During the sputtering processing, the substrates are typically relatively close to the source material, for example, 50 centimeters or less. Thus, for simplicity the figures in the present application are not drawn to scale.

In one embodiment where system 100 is used to deposit TCO material on a substrate, the source material can be tungsten-doped indium oxide (IWO=$In_2O_3$+$WO_3$ 0.5%–10%), ICO (ICO=$In_2O_3$+$C_eO_2$=ICO 0.5%–10%) or another appropriate material, and the pressure within the substrate processing chamber is set by the vacuum system to between 1-15 millitorr during the sputtering process. In one particular embodiment the source material can be in a cylindrical tablet form having a diameter of about 1" and height of about 2".

Figure 3:
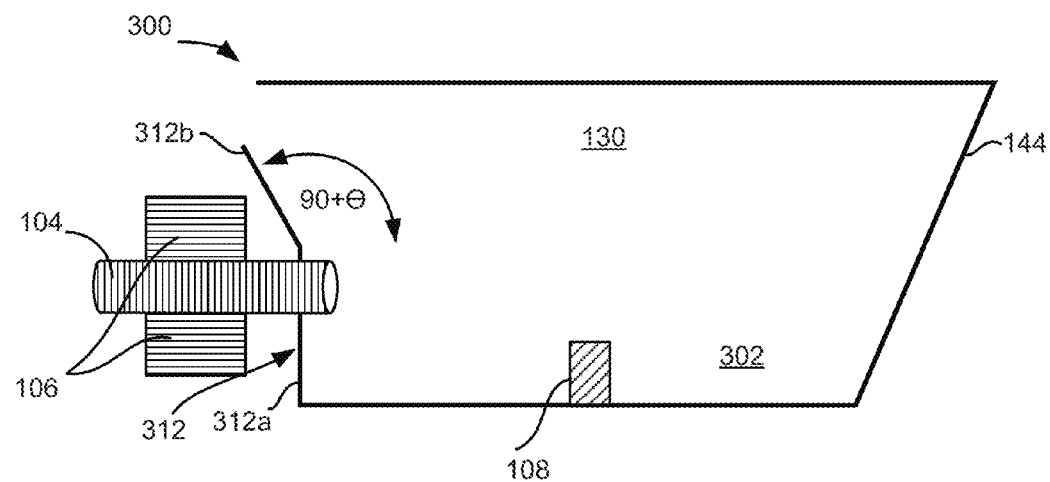
FIG. 3 is a simplified cross-sectional illustration of a substrate processing system according to some embodiments of the disclosure.

FIG. 3 is a simplified cross-sectional illustration of a substrate processing system 300 according to another embodiment of the disclosure that includes a substrate processing chamber 302. For convenience, the same reference numbers are used in FIG. 3 as in other figures to refer to like or similar components. Thus, the plasma gun 104 shown in FIG. 3 can be identical to or similar to the plasma gun 104 shown in FIG. 1. System 300 is similar to system 100 discussed with respect to FIG. 1 except that a sidewall 312 adjacent to the plasma gun 104 includes a first vertical portion 312a and a second angled portion 312b. First portion 312a extends from a bottom wall of the substrate processing chamber 302 at a vertical or near vertical angle and a second portion 312b of the sidewall extends from the first portion towards a top of the chamber at an obtuse angle as described with respect to FIG. 1. As shown in FIG. 3, angled portion 312b begins at a location above the opening in the sidewall through which plasma gun 104 extends into chamber 302. Thus, plasma gun 104 can be positioned at a 90 degree angle with respect to sidewall portion 312a and extend into chamber 302 through a vertical portion of a sidewall.

Figure 4:
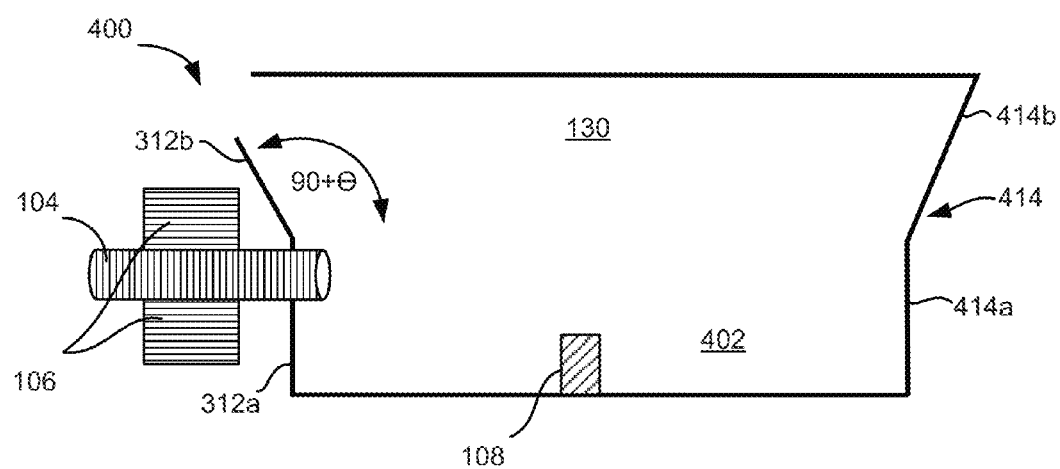
FIG. 4 is a simplified cross-sectional illustration of a substrate processing system according to some embodiments of the disclosure.

FIG. 4 is a simplified top view illustration of a substrate processing system 400 according to another embodiment of the disclosure that includes a substrate processing chamber 402. Substrate processing system 400 is similar to system 300 except that a sidewall 414 in chamber 302 includes first and second portions similar to sidewall 312. As shown in FIG. 4, sidewall 414 includes a first portion 414a that extends from a bottom wall of the substrate processing chamber 402 at a vertical or near vertical angle and a second portion 414b that extends from the first portion towards a top of the chamber at an obtuse angle as described with respect to FIG. 1.

In each of FIGS. 3 and 4, the height of the lower portion of each the substrate processing chambers 302 and 402 (i.e., the height of the generally vertical sidewall sections 312a and 412a, respectively) can be selected such that sidewall sections 312a and 412a are generally outside the distribution area of ions and vaporized source material generated by the plasma bombardment of the source target and thus are not a source of a significant volume of unwanted deposition of the source material. Also, while note shown in the figures for simplicity, substrate processing systems 300 and 400 can each include many of the same components as substrate processing system 100 shown in FIG. 1 including, but not limited to one or more gas nozzles, an exhaust valve, a vacuum system, a temperature control system, and others features useful or required to deposit thin film layers, such as a thin film TCO layer, over a substrate.

Figure 5:
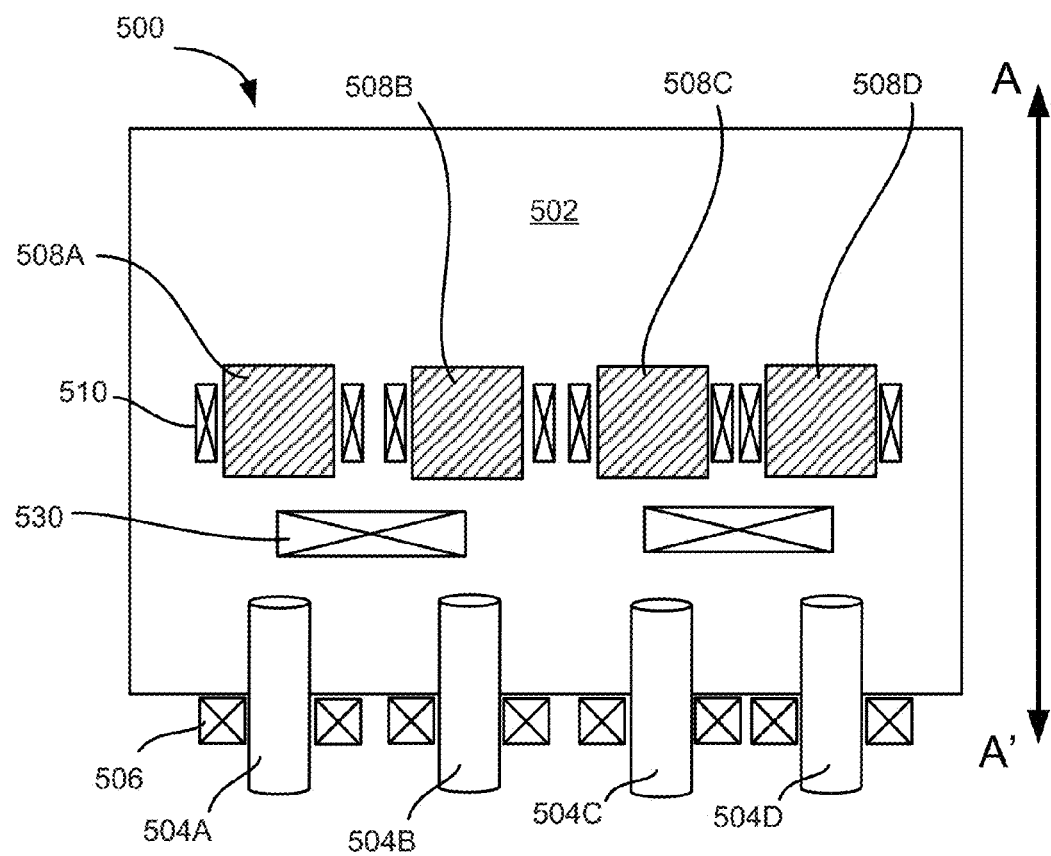
FIG. 5 is a simplified top view schematic diagram of a substrate processing system according to some embodiments of the disclosure.

Some embodiments of the disclosure include multiple plasma guns and multiple source material holders as shown in FIG. 5, which is a simplified top view schematic diagram of a substrate processing system 500 according to some embodiments of the disclosure. As shown in FIG. 5, system 500 includes a substrate processing chamber 502, multiple plasma guns 504A-504D and a corresponding number of source material holders 508A-508D. Each individual plasma gun 504 includes one or more electromagnets 506 and each source material holder 508 includes one or more electromagnets 510. Magnets 506 and 510 combine to direct the ion streams generated by each plasma gun to a target of source material within its corresponding source material holder. During a deposition process, substrates (not shown) can be transported through the chamber on a conveyor belt in the direction indicated by line A-A' above the sources of material as described with respect to substrate processing system 100 discussed above.

Figure 6A:
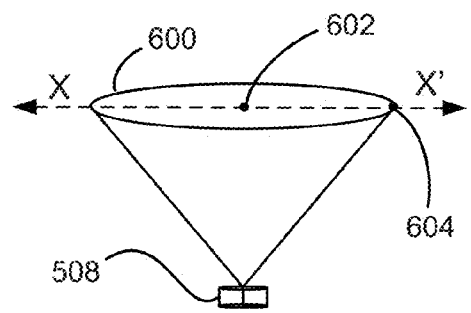
FIG. 6A is an illustration depicting a conical-shaped distribution of source material from a source material holder during a deposition process according to some embodiments of the disclosure.
Figure 6B:
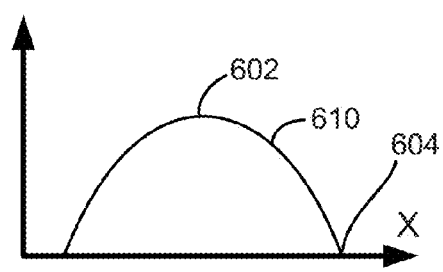
FIG. 6B is a graph illustrating a density of source material distributed along the line X-X' shown in FIG. 6A according to some embodiments of the disclosure.

As the plasma beams from each plasma gun bombard the target source material in each respective source material holder 504, the source material is vaporized and ionized scattering in a conical-shaped distribution pattern 600 as shown in FIG. 6A. The concentration of ions and other vaporized source material at any given point across a diameter of the conical-shaped distribution pattern (e.g., as shown by the line X-X') generally follows a cosine distribution function 610 as discussed above and as shown in FIG. 6B where the concentration is highest at a center portion 602 of conical distribution pattern 600 and lowest at its outer edges 604. Generally, a higher concentration of ions and other vaporized source material results in a higher deposition rate of source material on the substrate in areas of the substrate exposed to the higher concentration.

Figure 6C:
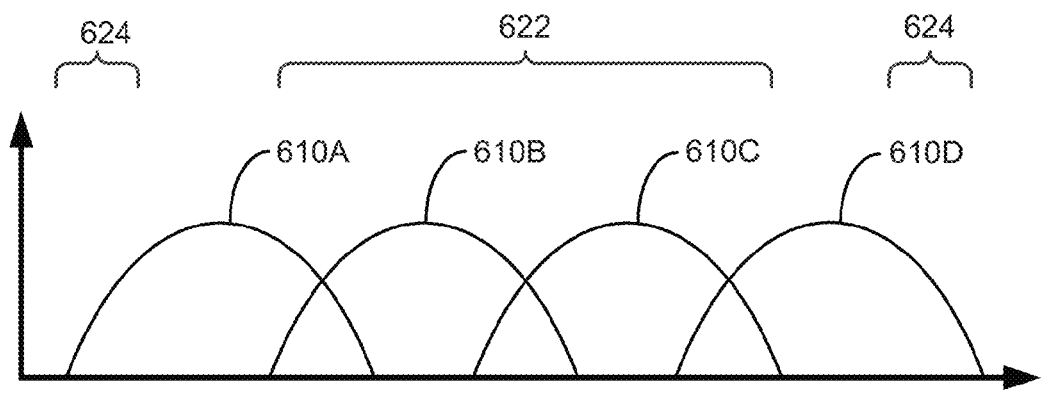
FIG. 6C is a graph illustrating a distribution of source material along a cross section of a substrate carrier from the four separate source material holders in the substrate processing system of FIG. 5 according to some embodiments of the disclosure.

Within substrate processing system 500, the four plasma guns 504A-504D and the four material source materials holders 508A-508D employed in the substrate processing system are positioned such that the conical-shaped distribution pattern of ionized source material generated from each individual source material holder overlaps with the conical-shaped distribution pattern of ionized source material generated from its adjacent source material holders. As an example, reference is made to FIG. 6C, which is a graph illustrating a distribution of source material from the four separate source material holders 508A-508D in the substrate processing system of FIG. 5. In FIG. 6C, ion distribution curve 610A corresponds to ions and vaporized source material from source material holder 508A, ion distribution curve 610B corresponds to ions and vaporized source material from source material holder 508B, ion distribution curve 610C corresponds to ions and vaporized source material from source material holder 508C, and ion distribution curve 610D corresponds to ions and vaporized source material from source material holder 508D.

Figure 6D:
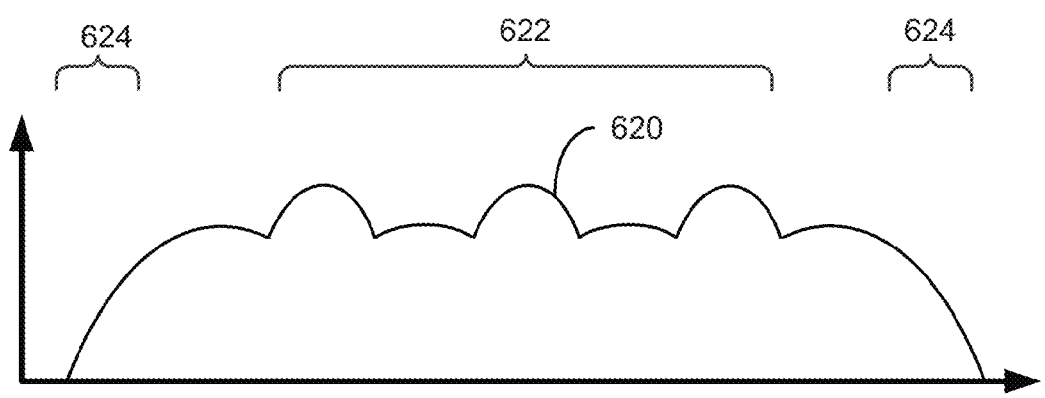
FIG. 6D is a graph illustrating deposition rates along a width of a substrate processing chamber according to some embodiments of the disclosure.

As shown in FIG. 6C, curves 610A-610D overlap in central area 622. This overlap results in an increased deposition rate of source material on substrates (or portions of substrates) positioned within area 622 as shown in FIG. 6D, which is a graph illustrating a rate of deposition of source material according to some embodiments of the disclosure. In FIG. 6D, line 620 represents a rate of deposition of source material along a width of substrate processing chamber 500. Thus, as shown in FIG. 6D, the deposition rate is higher in central area 622 than at outer areas 624. The higher deposition rate in the overlapping areas can, in turn, allow for faster processing by, for example, either a faster rate of travel on the conveyor belt or the chamber can have a shorter length that the substrates travel through during the deposition process.

Figure 6E:
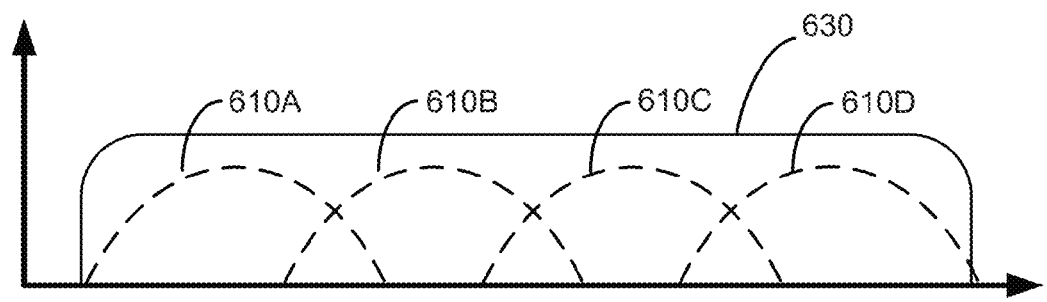
FIG. 6E is a graph illustrating deposition rates along a width of a substrate processing chamber according to some additional embodiments of the disclosure.

Referring back to FIG. 5, in some embodiments of the disclosure, one or more electromagnets 530 can be positioned along exterior surfaces of the chamber (e.g., on top of the chamber or along the chamber sidewalls) to redistribute the ions generated from the plasma for a more even distribution across the width of chamber 502. For example, FIG. 6E depicts the four overlapping ion distribution curves 610A-610D, one for each of the plasma guns 504A-504D and its corresponding source material positioned on a holder 508A-508D, in dotted lines. The cumulative ion distribution from the four plasma guns can be redistributed across the width of chamber 502 according to embodiments of the disclosure by one or more electro magnets 530 appropriately sized and positioned to alter the ion distribution and redistribute it more evenly across the chamber width as shown by curve 630, which in turn results in more uniform deposition thicknesses across the substrate. In still other embodiments, one or more screens (not shown) can be employed within the substrate processing chamber 502, in addition to or instead of electromagnets 535, to prevent some portion of ionized source material in the areas of high concentration from reaching substrates positioned on the substrate carrier further ensuring uniform deposition rates across the width of the substrate carrier.

While substrate processing system 500 was shown as including four plasma guns 504A-504D and four source material holders 508A-508D, embodiments of the disclosure are not limited to any particular number. In some embodiments, fewer or more than four pairs of plasma guns and corresponding source material holders can be employed. For example, two plasma guns and two corresponding source material holders can be employed in some embodiments while six plasma guns and size corresponding source material holders can be employed in other embodiments. Also, as one specific example, chamber 502 can have a width of approximately one meter and the plasma guns 504A-504D and source material holders 508A-508D can be spaced apart from each other at equal distances along the width of the chamber.

Figure 7:
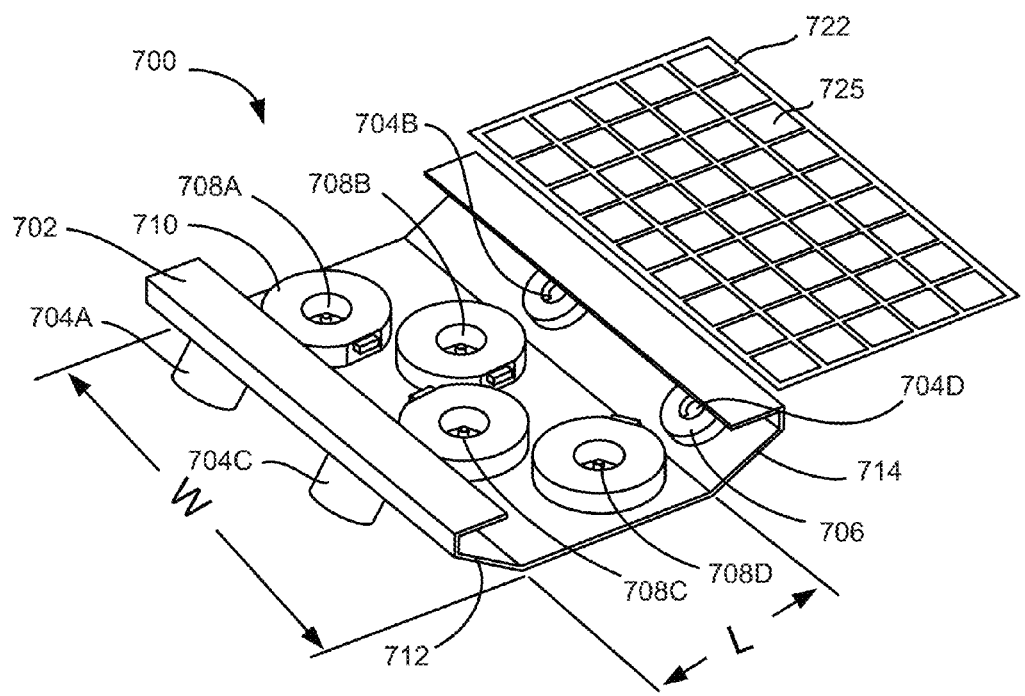
FIG. 7 is a simplified perspective view illustration of a substrate processing system according to some embodiments of the disclosure.
Figure 8:
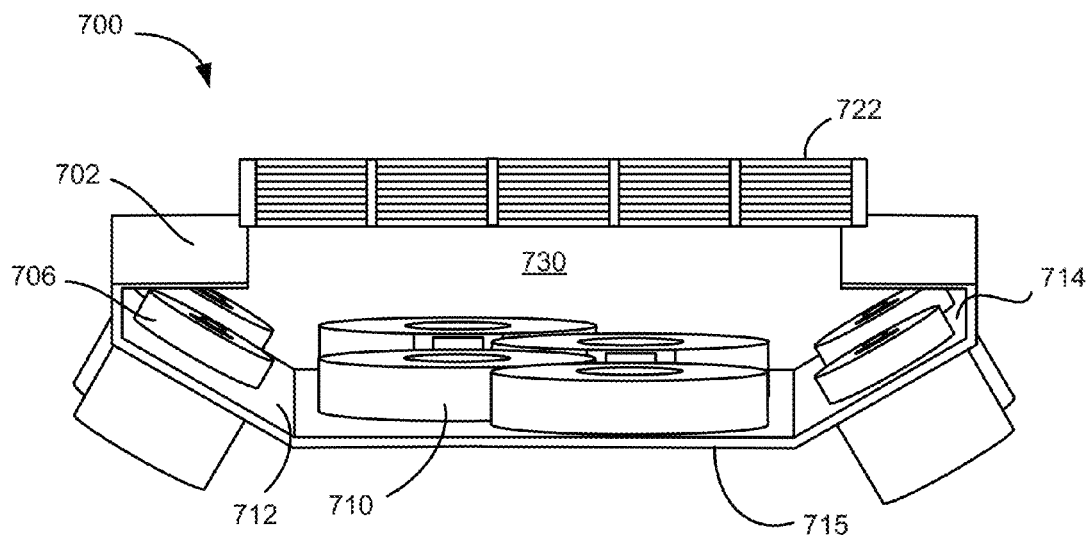
FIG. 8 is a simplified front perspective view illustration of the substrate processing system shown in FIG. 7.
Figure 9:
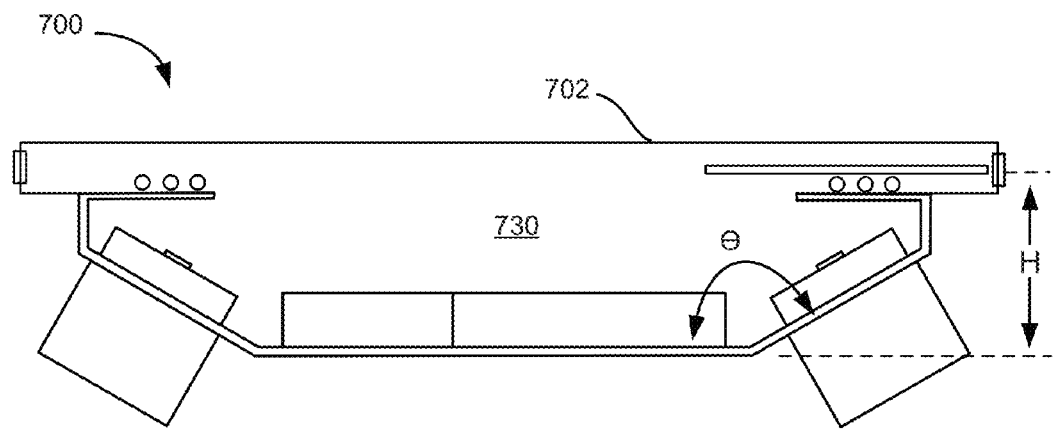
FIG. 9 is a simplified front plan view illustration of the substrate processing system shown in FIG. 7.

Reference is now made to FIGS. 7-9 which illustrate a substrate processing system 700 according to some embodiments of the disclosure. Specifically, FIG. 7 is a top perspective view of substrate processing system 700, FIG. 8 is a front perspective view of substrate processing system 700 and FIG. 9 is a front plan view of the substrate processing system. As shown in FIGS. 7-9, substrate processing system 700 includes a chamber 702 (of which only the substrate processing portion is shown), four plasma guns 704A-704D and a corresponding number of source material holders 708A-708D. A substrate carrier 722 that holds multiple substrates 725 can be moved through a deposition zone 730 of the substrate processing chamber 702 in a manner similar to substrate carrier 122 described above with respect to FIG. 1. In the particular embodiment shown in FIG. 7, substrate carrier 722 holds a 5×9 array of substrates 725, but embodiments of the disclosure are not limited to a substrate carrier holding any particular number of substrates and in other embodiments carrier 722 can carry fewer or more substrates arranged in a differently dimensioned array or arranged in other manners that do not constitute an array.

Substrate processing chamber 702 further includes a first angled sidewall 712 though which plasma guns 704A and 704C extend and a second angled sidewall 714 through which plasma guns 704B and 704D extend. Each of sidewalls 712 and 714 extends away from a bottom 715 of chamber 702 at an obtuse angle θ. As shown in FIG. 9, the angled sidewalls 712, 714 allow the plasma guns 704A-704D to be placed to the side of the source material holders 708A-708D at a reduced height (H) within the chamber as compared a chamber with to vertical sidewalls in which the plasma guns are spaced further above a bottom of the substrate processing chamber. The reduced height of the sidewalls 712, 714 allows the substrate carrier 722 to be moved along a path that is closer to the source material as compared to a chamber with vertical sidewalls. This, in turn, helps ensure that more of the source material is deposited on substrates within the substrate carrier as opposed to chamber walls thereby improving yield of the source material. Larger angles θ enable closer placement of the substrate carrier. In some embodiments, θ is greater than 90 degrees and less than 145 degrees, and in some embodiments θ is between 110 and 125 degrees.

An electromagnet 706 is positioned around each of the four plasma guns 704A-704D and an electromagnet 710 is positioned around each of the four source material holders 708A-708D. Electromagnets 706 and 710 combine to guide the plasma beams generated by each of the plasma guns 704A-704D towards the target source material held in the corresponding source material holder 708A-708D. Electromagnets 706 and 710 can be sized and positioned to ensure that the magnetic fields generated line-up vertically onto the source material targets positioned within the source material holder 708A-708D thereby improving ionization and vaporization of the target source material.

Figure 10A:
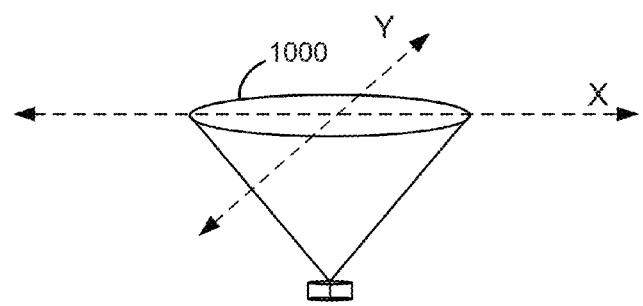
FIG. 10A is an illustration depicting distribution of source material during a deposition process according to some embodiments of the disclosure.
Figure 10B:
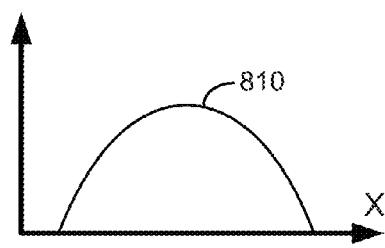
FIG. 10B is a graph illustrating density distribution of source material distributed along the X-axis shown in FIG. 10A.
Figure 10C:
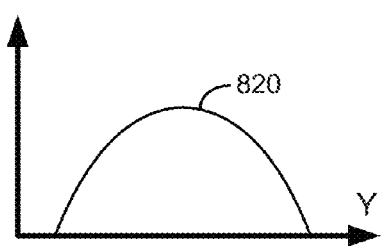
FIG. 10C is a graph illustrating density distribution of source material distributed along the Y-axis shown in FIG. 10A.

As shown in FIGS. 7 and 8, source material holders 708A-708D are spaced along the bottom 715 of substrate processing chamber 702 in evenly staggered positions. When bombarded with ions from the plasma guns, source material positioned within each of the source material holders 708A-708D is ionized and scattered in a conical-shaped pattern within the deposition zone 730 as discussed above with respect to FIG. 6C. FIG. 10A is an illustration depicting this same conical-shaped distribution 1000 of source material and further showing two interesting axis X and Y along a circular slice of distribution 1000. FIGS. 10B and 10C are graphs illustrating density distribution of source material distributed along the X-axis and Y-axis, respectively, shown in FIG. 10A.

As shown in FIGS. 10B and 10C, the concentration of ions and other vaporized source material at any given point across the diameter of the conical-shaped distribution pattern in both the X-axis and the Y-axis (or any axis through the diameter of the circle lying in the plane defined by X and Y) follows a cosine distribution function 810 and 820 where the concentration is highest at a center portion of conical the distribution patterns and lowest at its outer edges. Staggering the source material holders along the width of substrate processing chamber 702 enables the areas of overlap of ionized and vaporized source material that is deposited onto substrates within substrate carrier 722 to be maximized and evenly spaced allowing improved deposition uniformity.

Figure 11:
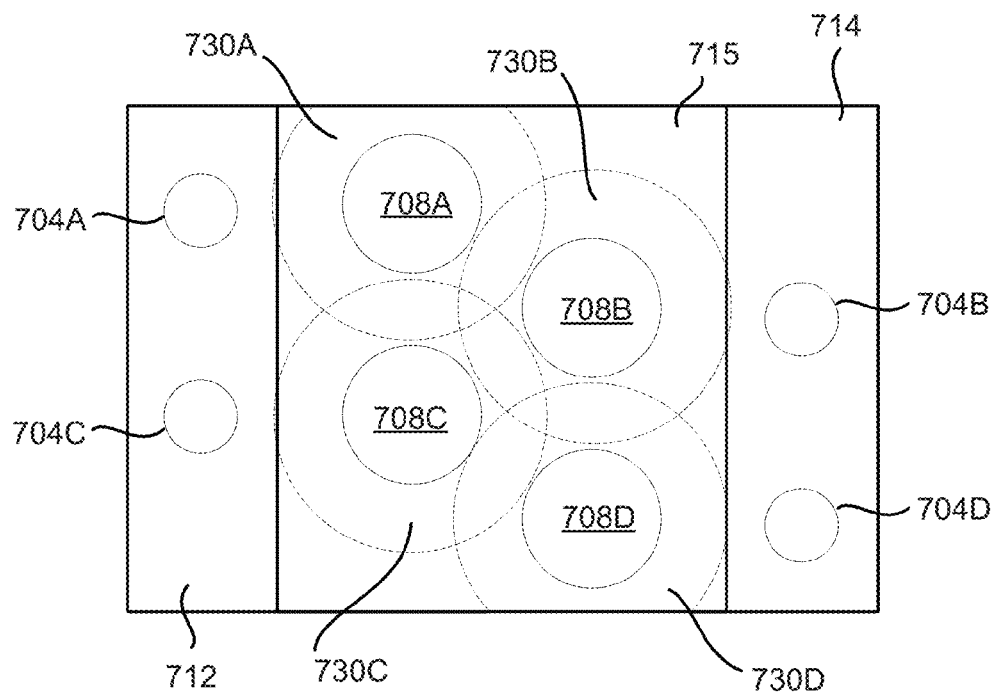
FIG. 11 is a simplified top view schematic diagram of a substrate processing system according to some embodiments of the disclosure.

For example, referring to FIG. 11, which is a simplified top view schematic diagram of substrate processing system 700, a distribution pattern 730A-730D is generated from the source target material held in each of the source material holders 708A-708D upon plasma bombardment. As shown in FIG. 11, staggering source material holders 708A-708D enables the distribution pattern 730A generated from source material within source material holder 708A to equally overlap with both distribution pattern 708B and 708C. Similarly, distribution pattern 730B generated from source material within source material holder 708B equally overlaps with distribution patterns 708A, 708C and 708D; distribution pattern 730C generated from source material within source material holder 708C equally overlaps with distribution patterns 708A, 708B and 708D; and distribution pattern 730D generated from source material within source material holder 708D equally overlaps with both distribution pattern 708B and 708C. Substrate processing chamber 700 can further include one or more electromagnets and/or screens to further improve deposition uniformity as described with respect to substrate processing chamber 500.

Figure 12:
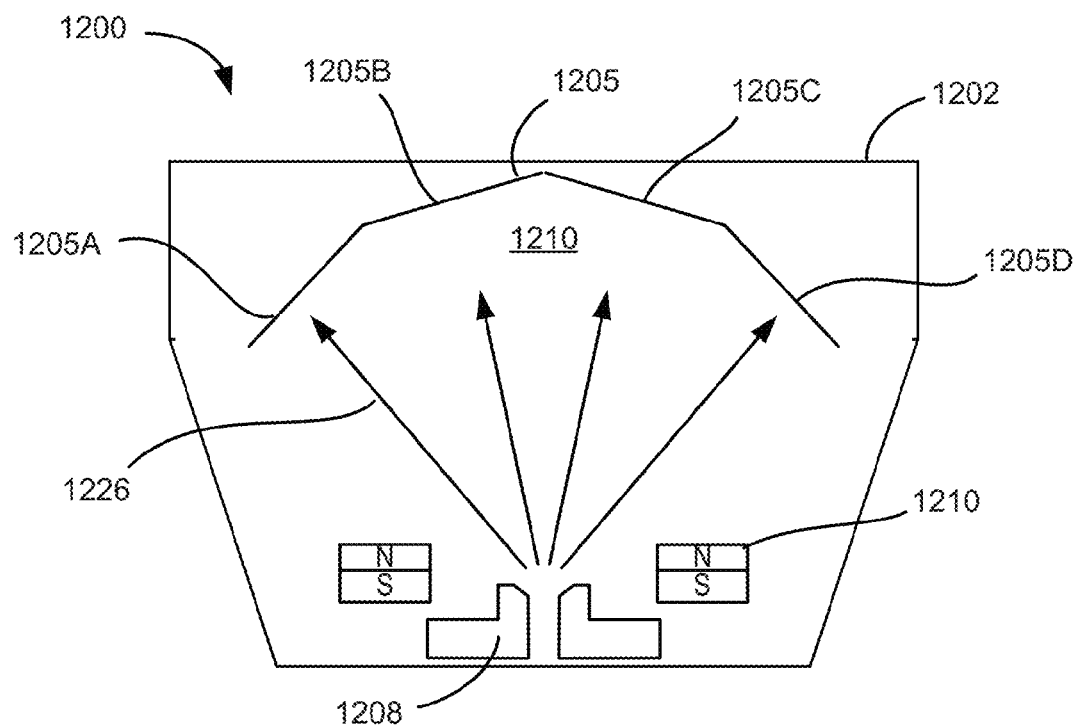
FIG. 12 is a simplified front view schematic diagram of a substrate processing system according to some embodiments of the disclosure.
Figure 13:
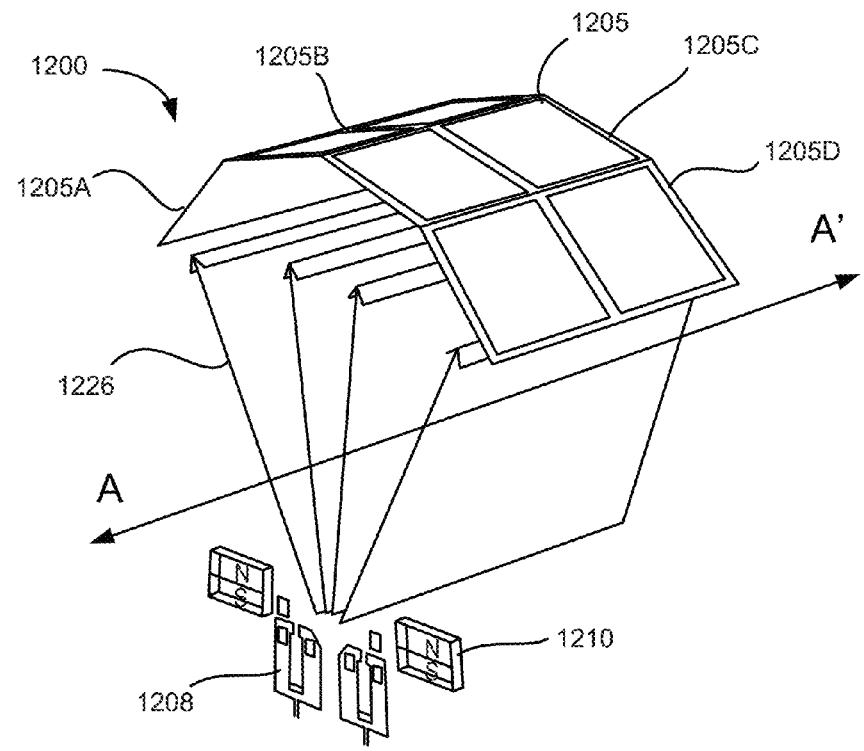
FIG. 13 is a simplified perspective view schematic diagram of the substrate processing system shown in FIG. 12.

In order to further improve deposition uniformity and further improve yield of the source material, some embodiments of the disclosure provide a domed substrate carrier that includes multiple panels, each of which holds one or more substrates, positioned at different angles with respect to each other forming a dome-like structure. FIG. 12 is a simplified side view (looking into a width of the substrate processing tool) schematic diagram of a substrate processing system 1200 according to some embodiments of the disclosure, while FIG. 13 is a simplified perspective view of substrate processing system 1200 with chamber 1202 omitted. As shown in FIGS. 12 and 13, substrate processing system 1200 includes a substrate processing chamber 1202 and a domed-shaped substrate carrier 1205. Substrate processing system 1200 also includes a source material holder 1208 and an electromagnet 1210 surrounding the source material holder 1208. Substrate processing system 1200 can include many of the same components as chamber 102 shown in FIG. 1 including, but not limited to a plasma gun and associated electromagnets, one or more gas nozzles, an exhaust valve, a vacuum system, a temperature control system, and others none of which are shown in FIG. 12 for simplicity.

As shown in FIG. 12, domed substrate carrier 1205 includes four panels 1205A-1205D including two inner panels 1205B and 1205C and two outer panels 1205A and 1205D. Inner panels 1205B and 1205C are positioned in an opposing mirrored relationship to each other as are outer panels 1205A and 1205D. Each of the panels is connected to its adjacent panel within the substrate processing zone at a predetermined angle selected to improve deposition uniformity and deposition rate of source material over the substrates positioned within the panels.

During substrate processing, substrate carrier 1205 can be moved through a substrate processing region 1210 of chamber 1202 by a conveyor belt or similar substrate carrier movement system in the direction A-A' (shown in FIG. 13). As source material from within source material holder 1208 is ionized and vaporized, ions scatter along paths indicated by arrows 1226 following a conical-shaped pattern having a cosine-distribution concentration along the diameters of any circular slices or the cone as described above with respect to at least FIGS. 1 and 6C. In a flat substrate carrier, the distance between substrates at the outer edges of the carrier and the source material is greater than the distance between substrates in the center of the carrier and the source material which can result in different rates of deposition that can be corrected for by, for example, some of the techniques described above. With domed substrate carrier 1205, substrates in outer panels 1205A and 1205D are essentially the same distance from the source material within holder 1208 as substrates in inner panels 1205B and 1205C. The similar spacing between substrates in the different panels helps even deposition uniformity further and helps increase deposition rate on substrates in the outer panels.

Figure 14:
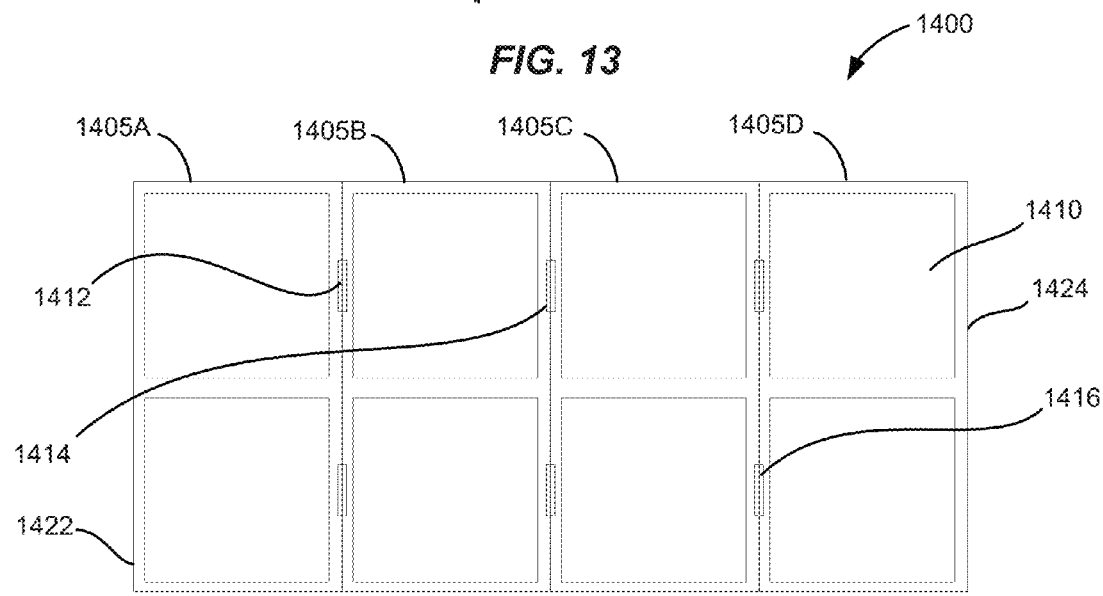
FIG. 14 is a simplified top view illustration of a substrate carrier according to some embodiments of the disclosure.

In some embodiments, adjacent panels are connected to each other by hinges that enable the panels to rotate around an axis through the hinges. For example, FIG. 14 is a simplified top view illustration of a substrate carrier 1400 according to some embodiments of the disclosure that can be, for example, substrate carrier 1205. Substrate carrier 1400 includes four panels 1405A-1405D, each of which holds two substrates 1410. Panel 1405A is connected to panel 1405B by hinges 1412; panel 1405B is connected to panel 1405C by hinges 1414; and panel 1405C is connected to panel 1405D by hinges 1416. The hinges enable the substrate carrier 1400 to be configured in a flat orientation or into a curved dome-shaped configuration as substrate carrier 1205 is depicted in FIGS. 12 and 13.

During fabrication of a solar cell or other structure on substrates held within substrate carrier 1205, the substrate carrier may moved through multiple different tools so that multiple different layers are deposit on, etched, cleaned or otherwise processed as part of the formation of the solar cell or other structure formed on substrates held within the substrate carrier 1205. As the substrate carrier 1400 is transported between tools or otherwise moved within a fabrication facility, it can be beneficial for the substrate carrier 1400 to be oriented such that each of its panels 1405A-1405D are substantially flat. For example, as a flat substrate carrier, multiple substrate carriers can more easily be stacked upon each other in an appropriate holding tray and the substrate carriers can more readily inserted into or removed from a particular substrate processing chamber through, for example, a slit valve.

Figure 15A:
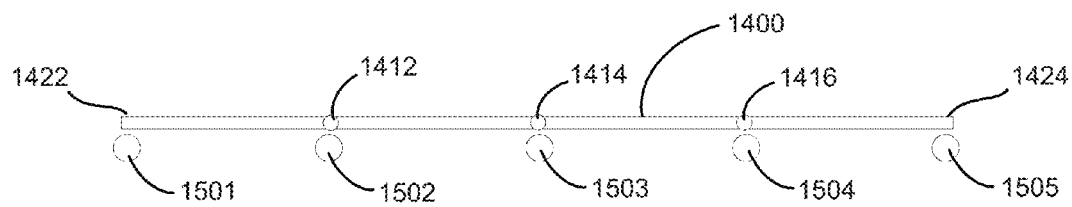
FIG. 15A is a schematic illustration of a first portion of a substrate carrier support system according to some embodiments of the disclosure that can be used with any of the substrate processing chambers described herein.
Figure 15B:
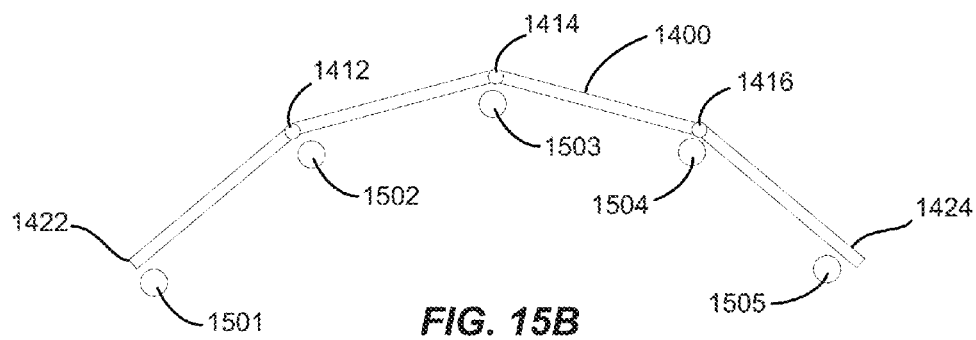
FIG. 15B is a schematic illustration of a second portion of the substrate carrier support system shown in FIG. 15A according to some embodiments of the disclosure.

When the substrate carrier 1400 is within a substrate processing chamber, such as chamber 1202, however, the hinges 1412, 1414, and 1416 enable the shape of the substrate carrier to be switched from a flat orientation to the domed-shape configuration shown in FIGS. 12 and 13 that can be beneficial for the substrate processing step within a particular tool (e.g., to enable improved deposition uniformity and deposition rate). The transformation of the substrate carrier from a flat shape to a domed-shape can be done in a variety of different ways. As one example, illustrated in FIGS. 15A and 15B, the substrate carrier 1400 can be supported as it moves along a track between substrate processing tools and supported within substrate processing chamber 1202 by rails 1501-1505 that align with the hinges 1412, 1414 and 1416 and the outer edges 1422 and 1424 of the substrate carrier 1400. The rails 1501-1505 can be positioned in a horizontal plane at the entrance and exit of substrate processing chamber 1202 as shown in FIG. 15A. In between the entrance and exit, the rails can transition to different heights such that a central rail 1503 aligned with hinges 1414 is positioned above its immediately adjacent rails 1502 and 1504 that are aligned with hinges 1412 and 1416. Similarly, rails 1502 and 1504 can be positioned above outer rails 1501 and 1505 that are aligned with edges 1422 and 1424, respectively, as shown in FIG. 15B. As evident from a comparison of FIGS. 15A to 15B, as the rails transition to different heights to allow the panels to bend downward, the rails also become closer together to adjust for the decreasing width of the substrate carrier as it forms into its domed shape. A variety of different techniques can be used to transition substrate carriers from a flat to a domed shape and embodiments of the disclosure are not limited to any particular technique. In other embodiments, the substrate carrier 1205 can have each panel fixed at the desired angles without hinges. In such embodiments, the substrate carrier can remain in its domed shape as it is moved between different fabrication tools and as it is moved into and out of substrate processing chamber 1202. In still other embodiments, each of the different panels 1405A-1405D can be separate substrate carriers altogether that are moved through substrate processing chamber 1202 together in a side-by-side arrangement.

Figure 16:
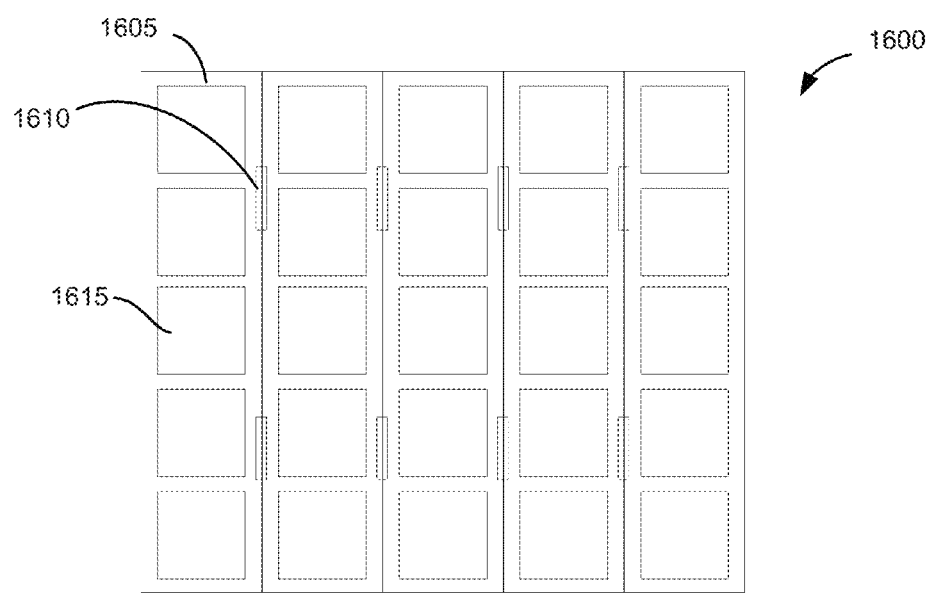
FIG. 16 is a simplified top view illustration of a substrate carrier according to some additional embodiments of the disclosure.

Furthermore, embodiments of the invention can include substrate carriers that have more than or fewer than four panels. As an example, reference is made to FIG. 16, which is a simplified top view illustration of a substrate carrier 1600 according to some additional embodiments of the disclosure. Substrate carrier 1600 includes five separate panels 1605 arranged in a side-by-side configuration similar to the manner in which panels 1405A-1405D are arranged within substrate carrier 1400. As shown in FIG. 16, each individual panel 1605 is configured to hold five (5) separate substrates 1615 enabling substrate holder 1600 to hold twenty-five (25) substrates for batch processing within a substrate processing chamber.

Figure 17:
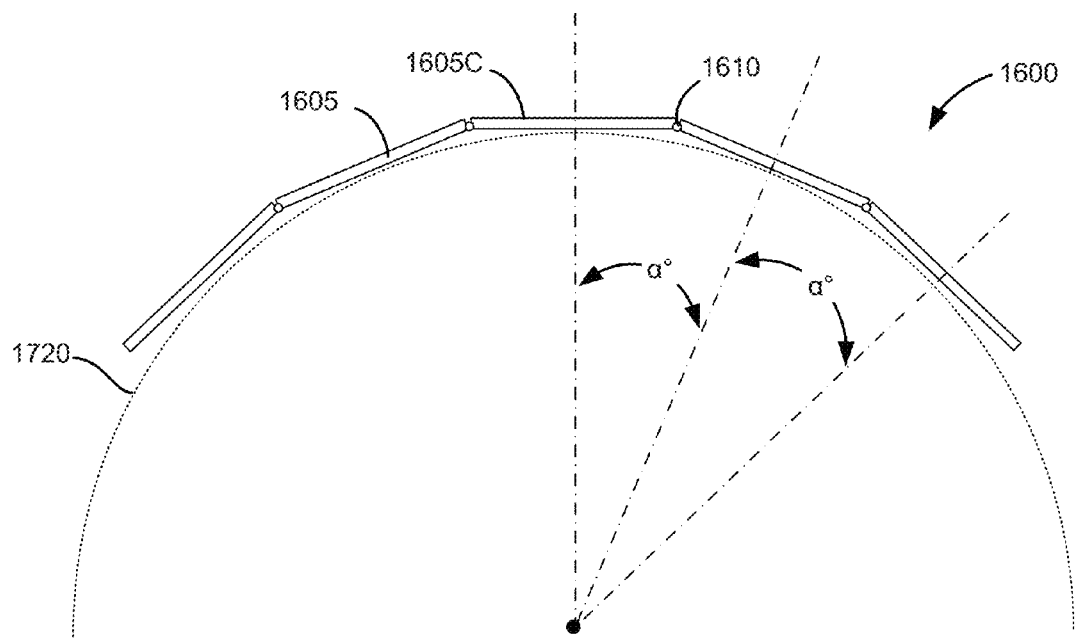
FIG. 17 is a side plan view of the substrate carrier shown in FIG. 16 according to some embodiments of the disclosure.

Substrate carrier 1600 includes hinges 1610 between each set of adjacent panels 1605. Hinges 1610 can be similar to the hinges in substrate carrier 1400 and can enable the different panels to be positioned in a domed-shape similar to substrate carrier 1400. While carrier 1400 had an even number of panels, however, substrate carrier 1600 has an odd number of panels. Thus, as shown in FIG. 17, which is a side plan view of substrate carrier 1600, the central panel 1605C can be positioned substantially flat, i.e., parallel to a bottom of the substrate processing chamber through which it is moved. Each of the other panels 1605A, 1605B, 1605D and 1605E can be angled to lie in a plane that is tangent to a point on a circle 1720 (shown in dotted lines) the diameter of which is dependent upon the size of the substrate processing chamber in which substrate carrier 1600 is used. In one particular embodiment, the angle, $\alpha$, between a diameter of circle 1720 that intersect a midsection of each of panels 1605 in the substrate carrier 1600 is 25.15 degrees.

Figure 18:
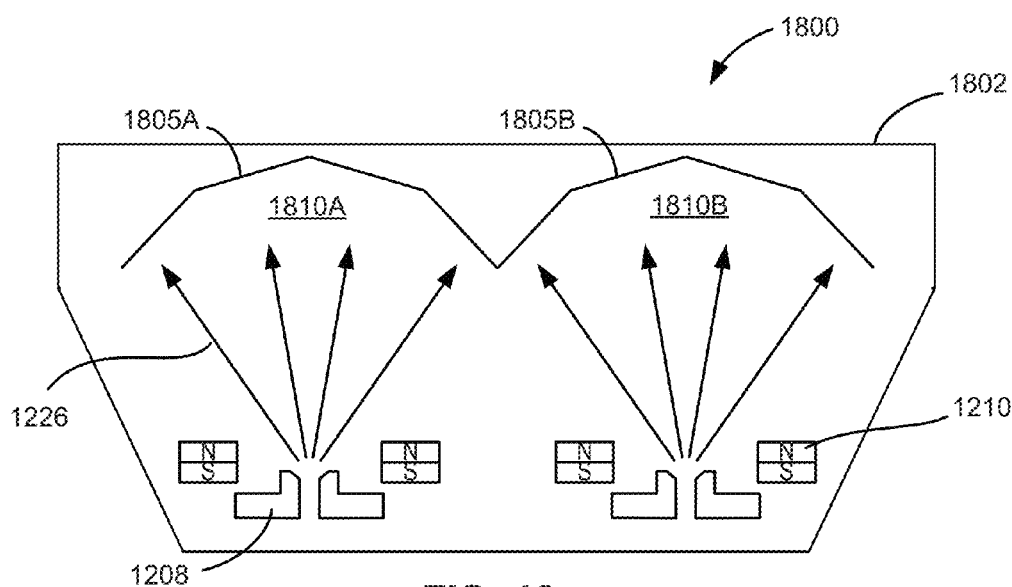
FIG. 18 is a simplified front view schematic diagram of a substrate processing system according to some additional embodiments of the disclosure.

Reference is now made to FIG. 18, which is a simplified front view schematic diagram of a substrate processing system 1800 according to additional embodiments of the disclosure. Substrate processing system 1800 can be similar to substrate processing system 1200, discussed with respect to FIGS. 12 and 13, except that it includes a substrate processing chamber 1802 having two side-by-side substrate processing regions 1810A and 1810B. Within each of the two substrate processing regions, are all the components necessary to deposit a thin film TCO layer or similar thin film layer over substrates moved through the regions on substrate carriers 1805A and 1805B, each of which can be representative of substrate carrier 1400, substrate carrier 1600 or a similar substrate carrier. Substrate processing system 1800 allows the two substrate carriers 1805A and 1805B, and thus the substrates supported by the carriers, to be moved through deposition zones 1810A and 1810B simultaneously thereby doubling the throughput of substrate processing system 1200.

The description above makes reference to specific examples of substrate processing systems according to embodiments of the disclosure. It is to be understood that these examples are illustrative and not limiting. For example, while various examples described above included one or more plasma guns positioned outside a substrate processing chamber, in some embodiments of the disclosure a miniaturized plasma gun can be placed inside the substrate process chamber. Such an arrangement can allow for one or more of the chamber sidewalls to be placed further away from the source material holders thus resulting in a reduced chance that ions and neutrals will be deposited on the sidewalls.

Further, while each of the examples was presented above as a separate embodiment, features from the various examples may be combined. For example, in one embodiment the angled sidewalls as described with respect to some of the embodiments can be combined with the multiple plasma guns and sources described with respect to other embodiments. Accordingly, although the disclosure has been described with respect to specific embodiments, it will be appreciated that the disclosure is intended to cover all modifications and equivalents within the scope of the following claims.

What is claimed is:

1. A substrate processing system comprising:
a substrate processing chamber having one or more sidewalls that at least partially define a substrate processing region and extend away from a bottom wall of the substrate processing chamber at an obtuse angle;
a source material holder configured to hold a source material within the substrate processing region;
a plasma gun operatively coupled to introduce a plasma beam into the substrate processing region;
one or more magnets operatively arranged to generate a magnetic field that guides the plasma beam to the source material holder;
a substrate carrier configured to hold one or more substrates within the substrate processing region; and
a substrate transport mechanism configured to move the substrate carrier through the substrate processing region during a substrate deposition process.

2. The substrate processing system of claim 1 wherein the one or more angled sidewalls include first and second opposing sidewalls spaced apart on opposite sides of the source material holder and wherein the plasma gun is positioned adjacent to the first opposing sidewall with the gun pointing in a direction perpendicular to the first opposing sidewall.

3. The substrate processing system of claim 1 wherein at least one of the one or more chamber sidewalls includes a first section that extends substantially vertically from a bottom of the chamber and a second section that extends from the first section towards a top of the chamber at the obtuse angle.

4. The substrate processing system of claim 1 wherein the one or more angled sidewalls include first and second opposing sidewalls spaced apart on opposite sides of the source material holder, each of the first and second opposing sidewalls including a first section that extends substantially vertically from a bottom of the chamber and a second section that extends from the first section towards a top of the chamber at the obtuse angle.

5. The substrate processing system of claim 1 wherein the substrate carrier holds a plurality of substrates and has first and second opposing ends that define a length of the substrate carrier and a width that is greater than the length.

6. The substrate processing system of claim 5 further comprising a substrate transport mechanism configured to move the substrate carrier through the substrate processing region during a substrate deposition process along a linear path at a constant speed such that the substrate carrier enters the substrate processing region with its first end and exits the substrate processing region with its second end.

7. The substrate processing system of claim 1 wherein the substrate carrier comprises a plurality of panels connected to each other by hinges, wherein each panel extends along a length of the substrate carrier and is configured to hold a plurality of substrates.

8. The substrate processing system of claim 7 wherein the substrate transport mechanism configured to move the substrate carrier through the substrate processing region during a substrate deposition process such that the panels of the substrate carrier are in a domed-shape as the substrate carrier passes through the substrate processing region.

9. The substrate processing system of claim 1 wherein the substrate transport carrier is configured to hold a plurality of substantially flat substrates in the substrate processing region in a dome-shaped arrangement such that a difference in distance between substrates at outer edges of the substrate carrier and the source material and between substrates in a center of the carrier and the source material is reduced.

10. The substrate processing system of claim 1 wherein the substrate transport mechanism configured to transport the plurality of substrates such that the plurality of substrates enter and exit the substrate processing chamber in a substantially flat arrangement and proceed through the substrate processing region in a dome-shaped arrangement.

11. The substrate processing system of claim 10 wherein the dome-shaped arrangement comprises four rows of substantially flat substrates with the substrates in each row being angled with respect to the substrates in an adjacent row.

12. A substrate processing system comprising:
a substrate processing chamber having one or more sidewalls that at least partially define a substrate processing region and extend away from a bottom wall of the substrate processing chamber at an obtuse angle;
a source material holder configured to hold a source material within the substrate processing region;
a plasma gun operatively coupled to introduce a plasma beam into the substrate processing region;
one or more magnets operatively arranged to generate a magnetic field that guides the plasma beam to the source material holder; and
a substrate carrier configured to hold one or more substrates within the substrate processing region;
wherein the substrate processing region of the chamber is at least 100% wider than it is long and the one or more angled walls include first and second opposing walls that define a length of the substrate processing chamber within the substrate processing region.

13. A substrate processing system comprising:
a substrate processing chamber having one or more sidewalls that at least partially define a substrate processing region;
a plurality of source material holders positioned within the substrate processing region, each configured to hold source material;
a plurality of plasma guns corresponding to the plurality of source material holders, each plasma gun in the plurality of plasma guns being operatively coupled to introduce a plasma beam into the substrate processing region;
a plurality of magnets operatively arranged to generate magnetic fields that, for each plasma beam generated by a plasma gun in the plurality of plasma guns, directs the plasma beam to its corresponding source material holder;
a substrate carrier configured to hold a plurality of substrates; and
a substrate transport mechanism configured to move the substrate carrier through the substrate processing chamber such that the plurality of substrates are moved through the substrate processing region.

14. The substrate processing system of claim 13 wherein the one or more angled sidewalls include first and second opposing sidewalls spaced apart on opposite sides of the plurality of source material holders, each extending away from a bottom wall of the substrate processing chamber at an obtuse angle, and wherein a first set of the plasma guns is positioned adjacent to the first opposing sidewall with the gun pointing in a direction perpendicular to the first opposing sidewall and a second set of the plasma guns is positioned adjacent to the second opposing sidewall with the gun pointing in a direction perpendicular to the second opposing sidewall.

15. The substrate processing system of claim 13 wherein the plurality of source material holders are positioned in an evenly-spaced staggered relationship such that a distribution of source material from each adjacent source material holder overlaps.

16. The substrate processing system of claim 13 wherein the substrate carrier holds a plurality of substrates and has first and second opposing ends that define a length of the substrate carrier and a width that is greater than the length and wherein the substrate processing system further comprises a substrate transport mechanism configured to move the substrate carrier through the substrate processing region during a substrate deposition process along a linear path at a constant speed such that the substrate carrier enters the substrate processing region with its first end and exits the substrate processing region with its second end.

17. The substrate processing system of claim 13 wherein the substrate carrier comprises a plurality of panels connected to each other by hinges, wherein each panel extends along a length of the substrate carrier and is configured to hold a plurality of substrates.

18. The substrate processing system of claim 17 further comprising a substrate transport mechanism configured to move the substrate carrier through the substrate processing region during a substrate deposition process such that the panels of the substrate carrier are in a domed-shape as the substrate carrier passes through the substrate processing region.

19. The substrate processing system of claim 18 wherein the substrate transport mechanism is further configured to move the substrate carrier into and out of the substrate processing chamber in a substantially flat shape.

20. The substrate processing system of claim 17 wherein the substrate carrier comprises a plurality of panels that extend along a length of the substrate carrier including first and second opposing inner panels spaced apart from each other in a mirrored relationship and third and fourth opposing outer panels spaced apart from each other in a mirrored relationship, wherein each of the plurality of panels is a substantially flat rectangular panel configured to hold a plurality of substrates and wherein the plurality of panels are connected together to form a dome-shape along a length of the substrate carrier.

21. The substrate processing system of claim 20 wherein the substrate carrier further comprises a central panel positioned between the first and second inner panels.

22. A method of depositing a layer over a plurality of substrates with a reactive plasma deposition process, the method comprising:
holding source material for the reactive plasma deposition process in a source material holder positioned within a substrate processing chamber;
generating a plasma beam from a plasma gun;
ionizing the source material by directing the plasma with a plurality of magnets to bombard the source material and generate ionized source material within a substrate processing region of the substrate processing chamber;
transporting the plurality of substrates through the substrate processing region of a substrate processing chamber in a substrate carrier to deposit the source material over the plurality of substrates, wherein the substrate carrier comprises a plurality of interconnected panels that enter the substrate processing chamber in a substantially flat arrangement and the plurality of interconnected panels are formed into a dome-shaped arrangement prior to passing through the substrate processing region.

23. The method of depositing a layer over a plurality of substrates set forth in claim 22 wherein the deposited layer is a transparent conductive oxide layer.

24. The method of depositing a layer over a plurality of substrates set forth in claim 23 wherein the source material comprises tungsten-doped indium oxide.

25. The method of depositing a layer over a plurality of substrates set forth in claim 22 wherein each panel in the plurality of interconnected panels is substantially flat and the dome-shaped arrangement is formed by changing an angle between each adjacent panel.

* * * * *